United States Patent
Leuschner

(10) Patent No.: US 6,614,048 B2
(45) Date of Patent: Sep. 2, 2003

(54) MEMORY ELEMENT WITH MOLECULAR OR POLYMERIC LAYERS, MEMORY CELL, MEMORY ARRAY, AND SMART CARD

(75) Inventor: Rainer Leuschner, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/159,156

(22) Filed: May 31, 2002

(65) Prior Publication Data

US 2002/0195600 A1 Dec. 26, 2002

(30) Foreign Application Priority Data

May 31, 2001  (DE) .......................................... 101 26 578

(51) Int. Cl.$^7$ .............................................. H01L 51/00
(52) U.S. Cl. ........................................ 257/40; 365/153
(58) Field of Search ................... 257/40, 613; 365/153; 313/504

(56) References Cited

U.S. PATENT DOCUMENTS

| | | | | |
|---|---|---|---|---|
| 4,802,951 A | * | 2/1989 | Clark et al. .................. | 156/630 |
| 4,819,210 A | * | 4/1989 | Miura et al. ................. | 365/106 |
| 4,902,555 A | | 2/1990 | Isoda et al. | |
| 4,904,065 A | * | 2/1990 | Yuasa et al. .............. | 350/350 S |
| 5,250,378 A | * | 10/1993 | Wang .......................... | 430/83 |
| 5,439,777 A | * | 8/1995 | Kawada et al. ............. | 430/270 |
| 5,505,879 A | * | 4/1996 | Wang .......................... | 252/582 |
| 6,451,942 B1 | * | 9/2002 | Li et al. ...................... | 526/258 |
| 6,486,501 B1 | * | 11/2002 | Kehr et al. .................. | 257/119 |

FOREIGN PATENT DOCUMENTS

| | | |
|---|---|---|
| DE | 44 23 782  * | 6/1994 |
| DE | 44 23 782 A1 | 1/1995 |
| EP | 0 363 147 A2  * | 11/1990 |

OTHER PUBLICATIONS

"The jury is still out, but Intel has joined the defense—Buy", Sundal Collier & Co., Opticom Technology, Norway, pp. 1–20.

* cited by examiner

*Primary Examiner*—Sara Crane
(74) *Attorney, Agent, or Firm*—Laurence A. Greenberg; Werner H. Stemer; Ralph E. Locher

(57) ABSTRACT

The memory cell or the memory array formed of such memory cells has different molecular or polymeric layers forming an electrochemical redox pair. A matrix acting as proton donors or acceptors is provided in the two different molecular or polymeric layers. If a corresponding voltage is applied between mutually crossing upper and lower interconnects, one layer of their molecules emits electrons to the interconnect. As a result the molecules are oxidized. At the same time, electrons flow from the other interconnect into the molecules of the other polymer layer. As a result the molecules of that layer are reduced. Charge transport is balanced by proton flow, so that the oxidation state of the two layers is stabilized. If the voltage polarity is reversed, the memory cell is rewritten to the initial form. The memory array is suitable where the number of read-outs significantly exceeds the number of write operations, for example in smart cards.

16 Claims, 1 Drawing Sheet

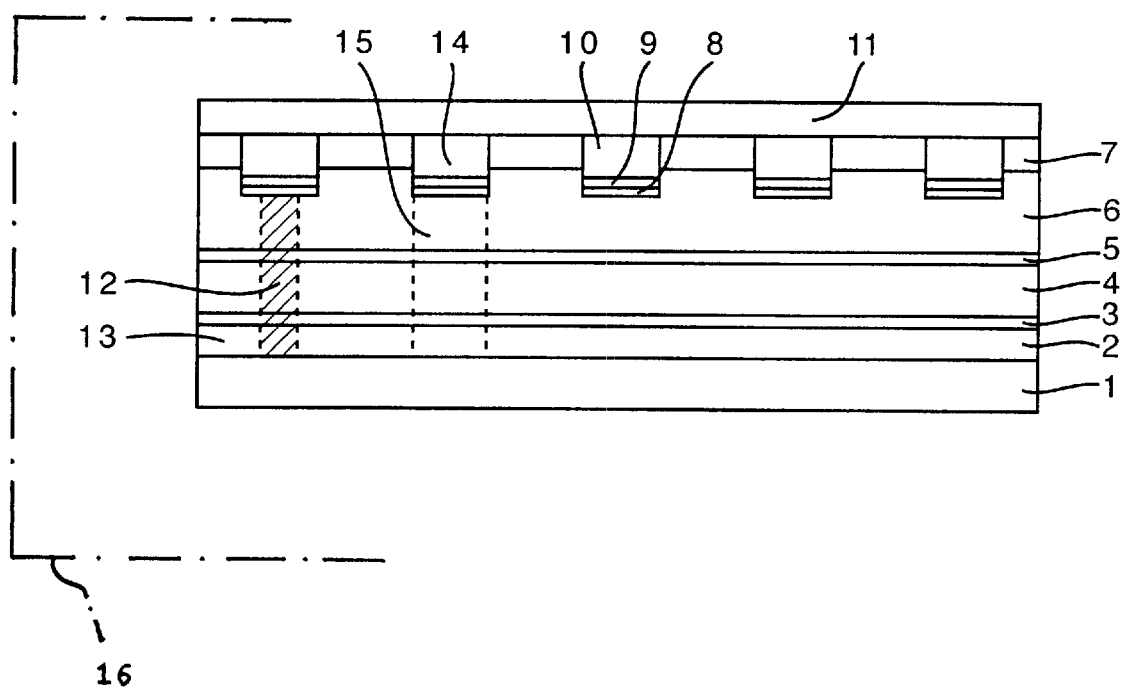

MEMORY ELEMENT WITH MOLECULAR OR POLYMERIC LAYERS, MEMORY CELL, MEMORY ARRAY, AND SMART CARD

BACKGROUND OF THE INVENTION

FIELD OF THE INVENTION

The invention lies in the memory technology field. More specifically, the invention the use of molecular or polymeric layers as memory elements and further relates to a memory cell comprising at least two different molecular or polymeric layers which form an electrochemical redox pair, a memory array comprising such memory cells, and a smart card comprising the memory array.

Various nonvolatile memory elements are known which are based on different physical principles. In addition to various advantages such as fast writing and reading times, the memory elements also have disadvantages, however, so that specific memory elements represent the best current solution possibility in each case only for a specific application. Thus, by way of example, SRAMs (synchronous RAMs) require a relatively large amount of space on a silicon substrate, since at least two transistors are required for each bit. In FLASH elements, relatively high voltages are required since charges have to be shot through a barrier. Other memory elements impose extreme requirements on production. Thus, during the fabrication of FRAMs (ferromagnetic RAMs), very high process temperatures of in excess of 700° C. are reached when ferromagnetic ceramics are deposited on the preprocessed silicon wafer. During the fabrication of MRAMs (magnetic RAMs), extremely thin magnetic layer sequences have to be fabricated, and the layer thickness has to be realized with a deviation of less than 0.1 nm. Furthermore, in magnetic memory elements, the memory content can be erased by external magnetic fields.

In addition to the above-described memory elements based on semiconductors, memories based on polymers or special molecules have also been proposed. One concept is concerned with very complex molecules that can assume two different states which are associated with an intramolecular charge flow. Such memory cells can be electrically addressed and also electrically read. (C. P. Collier et al., Science Vol. 285, 391 (1999) "Electronically Configurable Molecular-Based Logic Gate".) However, they presuppose the synthesis of highly complex molecules which generally have only a limited thermal stability and a limited number of write cycles, since secondary reactions are also possible owing to the complexity of the molecules.

U.S. Pat. No. 5,883,397 and German published patent application DE 44 23 782 A1 disclose a plastic functional element comprising a lower electrode and a transparent upper electrode. Arranged between the two electrodes there is in each case a first membrane made of a first oxidation-reduction material and a second membrane made of a second oxidation-reduction material. A contact area is formed between the two membranes and the contact areas of the electrodes are in each case arranged parallel to the contact area formed between the two membranes. The oxidation-reduction potentials of the two oxidation-reduction materials differ from one another, so that the oxidation state of at least one of the oxidation-reduction materials can be changed by irradiating the contact area formed between the membranes with light or by applying a voltage to the electrodes. This enables storage of information.

In the case of the configuration described in U.S. Pat. No. 5,883,397 and DE 44 23 782 A1 the potential difference between the two oxidation-reduction materials acts as a driving force for the electron transition. Depending on the sign of the potential difference, it is therefore possible with finite probability for an electron transition to take place between the two oxidation-reduction materials even without the presence of an external voltage at the electrodes. Therefore, if the memory cell is stored over a relatively long period of time, the information stored in the memory cell can be lost again, since the oxidation state of the two oxidation-reduction materials undergoes transition again to the thermodynamically most favorable state over a relatively long period of time.

U.S. Pat. No. 4,902,555 describes a hybrid circuit element having an electrical redox element made of redox material and a semiconductor element which is connected to the electrical redox element. The electrical redox element and the semiconductor element are arranged on a common substrate and connected to one another by electrical conductors. By way of example, a biomaterial or a pseudo-biomaterial is used as redox material. In the memory element in U.S. Pat. No. 4,902,555, individual molecules or monomolecular layers are used as materials which can be reversibly oxidized or reduced. Although such layers enable rapid oxidation or reduction of the materials, it is nonetheless only with very great difficulty that electrical contact can be made with these layers, so that these memory elements can only be fabricated in a complicated fashion and with high costs. Moreover, with such a configuration, there is the risk of the redox materials spontaneously undergoing transition to the thermodynamically most favorable state, in a manner dependent on the potential difference, by an electron transition taking place between the different redox materials. This ultimately leads to a loss of stored information if the memory content is not repeatedly refreshed over relatively long periods of time.

The above-described memory elements are either still at the development stage or they are comparatively complicated to fabricate. However, for specific applications, such as e.g. in smart cards, nonvolatile memories are required which can be fabricated at low cost and are comparatively robust in respect of handling. Thus, the memory elements should not require high voltages and should not be able to be overwritten by external magnetic fields. Moreover, the stored information should not be lost even if the smart card is stored over a relatively long period of time. In the case of application in smart cards, somewhat longer access times than usual can also be tolerated, that is to say access times in the range of microseconds instead of nanoseconds.

SUMMARY OF THE INVENTION

It is accordingly an object of the invention to provide a useful implementation of molecule or polymer layers as memory elements, which overcomes the above-mentioned disadvantages of the heretofore-known devices and methods of this general type and which provide for a memory element which can be fabricated simply and cost-effectively, which requires low voltages for writing and read-out, in which an item of information can be stored even over relatively long periods of time, and which cannot be overwritten by external magnetic fields.

With the foregoing and other objects in view there is provided, in accordance with the invention, a memory cell, comprising:

a first layer of electrically conductive material;

a second layer disposed on and electrically connected to the first layer, the second layer containing a first chemical compound adapted to be reversibly converted from a reduced form to an oxidized form;

a third layer disposed on the second layer and containing a second chemical compound adapted to be reversibly converted from an oxidized form to a reduced form; and a fourth layer of electrically conductive material disposed on and electrically connected to the third layer;

wherein at least one of the second layer and the third layer contain groups acting as proton donors or as proton acceptors.

With the above and other objects in view there is also provided, in accordance with the invention, a memory array, comprising:

a first layer constructed of mutually parallel interconnects;

a second layer disposed on and electrically connected to the first layer, the second layer containing a first chemical compound adapted to be reversibly converted from a reduced form to an oxidized form;

a third layer disposed on the second layer and containing a second chemical compound adapted to be reversibly converted from an oxidized form to a reduced form; and a fourth layer disposed on and electrically connected to the third layer, the fourth layer being constructed of mutually parallel interconnects arranged such that, in a plan view of the memory array, the interconnects of the first layer and the interconnects of the fourth layer form crossover points; and the second layer and/or the third layer having groups acting as proton donors or as proton acceptors.

In other words, the objects are achieved with a novel memory cell that comprises:

a first layer made of an electrically conductive material;

a second layer which is arranged on the first layer, is electrically connected to the latter and contains a first chemical compound which can be reversibly converted from a reduced form to an oxidized form;

a third layer, which is arranged on the second layer and contains a second chemical compound which can be reversibly converted from an oxidized form to a reduced form; and a fourth layer made of an electrically conductive material, which is arranged on the third layer and is electrically connected thereto, wherein the second and/or the third layer has groups which act as proton donors or as proton acceptors.

The memory cell thus comprises with the second and third layers at least two different molecular or polymeric layers which form an electrochemical redox pair. If a corresponding voltage is applied to the electrically conductive first layer and the electrically conductive fourth layer, the first chemical compound contained in the second layer emits electrons to the electrically conductive first layer, as a result of which the first chemical compound is oxidized. At the same time, electrons flow from the electrically conductive fourth layer into the third layer, so that the second chemical compound contained therein is converted into the reduced form by taking up an electron. If the polarity of the voltage is reversed, the memory cell can be rewritten to the original state. In order to compensate for the charges generated by the oxidation or reduction of the first and second chemical compounds, protons flow from the second layer into the third layer, so that the memory cell overall remains electrically neutral. This greatly reduces the probability of a spontaneous reverse reaction, for which reason the information contained in the memory cells is preserved over very long periods of time.

The second and third layers each containing the redox materials (first and second chemical compounds) can be embodied with a sufficient thickness in order to ensure simple electrical contact connection and simple and hence cost-effective fabrication.

The write operation is relatively slow since protons also have to migrate for charge balancing purposes. Protons are sluggish in relation to electrons, even though proton reactions are among the fastest chemical reactions known. As a result of the reduction or oxidation of the first or second chemical compound, the chemical state thereof changes, as a result of which the resistance of the cell formed from the layers also changes. Therefore, in order to read out the memory content of the cell formed by the layers, there is applied between the first and fourth layers a voltage which is so small that it does not lead to a change in the oxidation state of first and second chemical compounds, and the electrical resistance of the second and third layers arranged between first and fourth layers is determined. Thus, no proton transport is required during the read-out of the memory content, for which reason the read operation is significantly faster than the write operation. The memory cell according to the invention is therefore suitable in particular for those applications in which the memory content is read much more often than it is written.

The second and third layers of the memory cell can be formed solely by the first and second chemical compounds, respectively. In that case, in addition to their property as electron acceptor or donor, the chemical compounds must also act as proton acceptors or donors in order to be able to effect charge balancing between second and third layers.

The second and/or the third layer advantageously comprises a matrix in which the first or the second chemical compound is distributed. The matrix can influence the properties of the first or second chemical compound contained in it.

The molecules used as first or second chemical compound must have high-grade reversible redox reactions in order that a memory cell can be rewritten as often as desired. This generally presupposes relatively simple and usually also highly symmetrical molecules which do not permit any secondary reactions. The redox reactions must also proceed at relatively low voltages (<2V), since otherwise chemical reactions with other compounds which are present in the memory cell can occur.

For practical application of the memory cell, it is necessary that the memory content, i.e. the oxidation state of first and second chemical compounds, does not change over a time period of a number of months. Therefore, it is advantageous if the energy levels of the two cell states are as far as possible identical. This means that the chemical potential of the first chemical compound is approximately identical in its oxidized form and in its reduced form and/or the chemical potential of the second chemical compound is approximately identical in its reduced form and in its oxidized form. In this case, no forces which bring about a reverse reaction of the cell from one state to the other state act thermodynamically. The electrochemical potential of the redox reactions of first and second chemical compounds can be influenced by the acidity or basicity of the matrix which is used for the second and/or third layer of the memory cell. Therefore, the matrix is advantageously formed by a polymer having groups which can act as proton donors or as proton acceptors. Examples of groups which act as proton donors are the carboxyl group or the hydroxyl group. Examples of groups with proton acceptor properties are amino groups or imino groups.

In order that the cell is not transferred into the most stable form after a short time in accordance with its electrochemical potential, it is possible to provide an energy barrier which counteracts migration of the protons.

In accordance with a first embodiment, the matrix is formed as an energy barrier for proton transport. The proton conductivity of the matrix can be influenced for example by the number of groups which are present in the matrix and act as proton acceptors or proton donors. The number of such groups can be determined for example by using corresponding copolymers. A copolymer which is particularly suitable as matrix can be produced e.g. by copolymerization of acrylic acid or methacrylic acid with the corresponding esterified monomers, e.g. methyl acrylate or methyl methacrylate. Furthermore, the matrix can also be formed as a barrier for proton transport by incorporating into a polymer used as matrix groups having only slight proton acceptor properties, for example ether groups. A suitable ether group is the methoxy group, for example.

In accordance with a further embodiment, an intermediate layer is provided between second layer and third layer, which intermediate layer acts as an energy barrier for proton transport. Such a barrier may comprise, for example, insulating aluminum oxide or silicon dioxide. The information is then read out via a charging current. The barrier can also be formed from conductive amorphous carbon, titanium nitride or tungsten nitride. The stored information is then read out via a current flow through the barrier. The height of the energy barrier can be influenced by the selection of the material used and also by the layer thickness.

The barrier formed by the matrix or by an intermediate layer is generally configured in such a way that the voltage required for rewriting the memory cell to the other state does not exceed 5 V. On the other hand, however, the barrier must be high enough to prevent the memory cell from changing its state within a time period which generally lies in the range of a number of months.

In order to prevent diffusion of protons into the electrically conductive first or fourth layer, a proton barrier is preferably arranged between first layer and second layer and/or between third layer and fourth layer. Dense conductive layers made of e.g. titanium nitride, tantalum nitride or amorphous carbon, which can be applied by CVD or sputtering processes, are used as the proton barrier.

The information content of the memory cell is determined by the oxidation state of first and second chemical compounds which are contained in the second and third layer, respectively, of the memory cell. In the first state, the first chemical compound is in its reduced form and the second chemical compound is in its oxidized form. An oxidation or a reduction of the chemical compounds is brought about by applying a voltage. In the second state, the first chemical compound is then in its oxidized form, while the second chemical compound is present in the reduced form. It is possible to change over between the two states by reversing the polarity of the voltage.

Preferably, the first chemical compound is electrically neutral in its oxidized form and the second chemical compound is electrically neutral in its reduced form. In this case, the two logic states in the memory cell are characterized in that the molecules are all present in their neutral form in the first state and all the molecules are present in ionic form in the second state. This enables the cell state to be read out purely electrically.

The memory cell according to the invention can be integrated very well into electronic circuits. To that end, the memory cell is arranged on a substrate comprising electronic circuits.

If the memory cells according to the invention are combined with polymer-electronic circuits, they can also be deposited on flexible substrates.

The advantage of the nonvolatile memory cell according to the invention resides principally in its simple construction and the low outlay required for fabricating it. The thin (<100 nm) molecular or polymeric layers of the second and third layers can easily be fabricated by vapor deposition or spin coating or spray coating. Furthermore, the starting materials for the molecular or polymeric layers are generally also inexpensive, or their consumption is very low.

A plurality of memory cells can be combined in a very simple manner to form a memory array. Such a memory array comprises at least a first layer constructed from interconnects that are arranged parallel to one another;
- a second layer, which is arranged on the first layer, is electrically connected thereto and contains a first chemical compound which can be reversibly converted from a reduced form to an oxidized form;
- a third layer, which is arranged on the second layer and contains a second chemical compound which can be reversibly converted from an oxidized form to a reduced form; and
- a fourth layer, which is arranged on the third layer, is electrically connected thereto and is constructed from interconnects that are arranged parallel to one another, said interconnects being arranged in such a way that, in a plan view of the memory array, the interconnects from the first layer and the interconnects from the fourth layer form crossover points.

If a voltage is applied between one of the interconnects of the first layer and one of the interconnects of the fourth layer, then at the crossover point of the interconnects a perpendicular current flows through the second and third layers arranged between the interconnects. Therefore, one of the memory cells described above is formed at each crossover point of the interconnects. In order to construct such a crosspoint array, the second and third layers must have relatively high impedance, in order to minimize short-circuit currents via the adjacent cells. The specific conductivity of the layers suitably lies in the region of approximately $10^5 \, \Omega \, \mu m^2$. Although this limits the write times to the $\mu s$ range, this disadvantage is compensated for in many applications by the simple fabrication technique. Mutually crossing interconnects can be fabricated very simply and thin molecular or polymeric layers can easily be produced by vapor deposition or spin coating or spray coating. Such molecular or polymeric layers generally also have relatively high impedance, so that, given sufficient spacing between the memory cells, a special insulation of the memory cell can be dispensed with. This simplifies the fabrication to an extraordinary extent, since the unpatterned molecular or polymeric layers can simply be deposited onto the patterned lower interconnects. Contact holes have to be etched only in the case of the via connections to the upper interconnect plane.

The advantageous embodiments already described in the case of the memory cell can also be implemented correspondingly in the case of the memory array. Thus, the second or third layer may be formed by a matrix in which the first or second chemical compound is distributed The matrix may likewise be formed as a proton acceptor or proton donor by virtue of e.g. corresponding groups having proton donor or acceptor properties being contained in a polymer. Equally, an intermediate layer acting as a proton barrier may be provided between second and third layers.

The interconnects may likewise be protected against the indiffusion of protons by a proton barrier.

In order to be able to obtain memory cells in an array, the interconnects of the first and fourth layers must form crossover points. The interconnects are preferably oriented in such a way that they are arranged at right angles to one another in a plan view of the memory array.

The advantage of the memory array resides principally in its simplicity. Such crosspoint cells can be integrated into the topmost metallization layers of a silicon-based addressing circuit. In this case, it is possible to stack the memory cells since the memory cell itself does not require a silicon transistor assigned only to it.

The memory array has comparatively long write times in comparison with other known nonvolatile memory media. The read times are significantly shorter, however, so that the memory array is particularly suitable for applications in which the number of read-out operations significantly exceeds that of the write operations. Therefore, the memory array according to the invention can advantageously be integrated e.g. into a smart card.

Other features which are considered as characteristic for the invention are set forth in the appended claims.

Although the invention is illustrated and described herein as embodied in the useful implementation of molecular or polymeric layers as memory elements, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE shows a longitudinal section through a first embodiment of the memory cell.

DESCRIPTION OF THE PREFERRED EMBODIMENTS

Reference will now be had to the sole FIGURE of the drawing in the following description of the construction and the fabrication of the memory array. Firstly, a first layer 2 made of an electrically conductive material is applied on a substrate 1, generally a silicon substrate, into which electrical circuits are integrated. Metals such as e.g. aluminum, gold or copper, corresponding metallic alloys as well as electrically conductive polymers are suitable. A layer 3 which acts as a proton barrier and is composed of a dense conductive material, e.g. titanium nitride, tantalum nitride or amorphous carbon, is subsequently deposited on the layer 2. The layers are applied in a customary manner, such as, for instance, by CVD and sputtering processes. Afterward, the layers 2 and 3 are patterned and etched by means of customary methods, so that mutually parallel interconnects (conductor tracks) are obtained. The interspaces produced in the layer are filled with an insulating material, for example silicon dioxide. A second layer 4 is subsequently applied to the first layer formed from the interconnects (conductor tracks) and the insulation arranged between the interconnects. The second layer contains a first chemical compound which can be reversibly oxidized or reduced. The layer is applied by means of a customary method, e.g. spraying on or by a spin-on technique. Solvent that is possibly present is removed by a thermal treatment and a matrix is formed by polymerization of monomers. Patterning of the second layer 4 is not carried out in this embodiment. Patterning of the second layer 4 may be advantageous, however, for better definition of the active cell region. An intermediate layer 5, which acts as a proton barrier, is subsequently deposited onto the second layer 4. The intermediate layer is composed, for example, of amorphous carbon and may be applied e.g. by a PECVD method (Plasma Enhanced Chemical Vapor Deposition). The third layer 6 is subsequently applied, which contains a second chemical compound which can be reversibly reduced or oxidized. As in the case of the second layer 4, customary methods are used as well to fabricate the third layer 6, for example, spraying on or application by means of a spin-on technique. After evaporation of the solvent and, if appropriate, curing of the third layer 6, a further layer is applied, which acts as a proton barrier and may, for example, likewise be composed of amorphous carbon. A photoresist is subsequently applied and patterned. A channel 12 is produced by etching, which channel reaches as far as the plane of the silicon substrate 1 which contains the switching elements for the interconnects. The channel 12 is subsequently filled, e.g. by sputtering, with an electrically conductive metal, e.g. aluminum, in order to be able to produce an electrical connection between the upper interconnects and the switching element assigned thereto. The figure illustrates only one channel 12 for reasons of clarity. The photoresist with the metal deposited thereon is subsequently lifted off. For the fabrication of the interconnects of the fourth layer, afterward a photoresist is again applied on the layer 7 and patterned. Cutouts are subsequently introduced into the layer construction by etching, which cutouts are intended to receive the interconnects of the upper fourth layer. In a plan view of the array, the cutouts of the interconnects of the upper fourth layer run at right angles to the interconnects of the lower first layer 2. After etching, a layer 8 acting as a proton barrier and made e.g. of amorphous carbon and an electrically conductive layer 9 likewise acting as a proton barrier and adhesion layer are applied. A layer made of an electrically conductive material, e.g. aluminum, is then deposited onto the latter and fills the cutouts. Afterward, the resist is lifted off together with the layers deposited on it, so that the plane of the upper interconnects is obtained. The interconnects of the upper layer, which represent the fourth layer in the sense of the invention, reach partly into the third layer 6 in order to be able to ensure a sufficient electrical contact. Finally, the layer construction is additionally covered with a protective layer 11, which may be composed of silicon dioxide, for example, bonding pads being spared. In an advantageous embodiment of the invention, the memory element is utilized in a smart card. A smart card body 16 is diagrammatically indicated to illustrate the integration of the memory element into the device.

Depending on the material which is used for the second layer 4 and the third layer 6, it is also possible to dispense with an intermediate layer 5 acting as a proton barrier. The construction of the memory array is then reduced by one layer.

In order to be able to rewrite a memory cell of the array, a voltage is then applied between specific interconnects, e.g. the interconnect 13 in the second layer 4 and the interconnect 14 of the upper layer. A vertical current can then flow from the upper interconnect 14 to the lower interconnect 13, so that a memory cell is defined in the region 15. Under the action of the voltage, the layer 4, which is intended to comprise a matrix CH and the molecules A which are currently in the reduced form, emits electrons from its molecules A to the interconnect 13, as a result of which the molecules A are oxidized to $A^+$. At the same time, electrons flow from the interconnect 14 into the third layer 6, which comprises the matrix D and the molecules B which are currently in the oxidized form, and reduce the molecules B to $B^-$. If the polarity of the voltage is reversed, the memory cell can be written back to the initial form by reducing the molecules $A^+$ back to A in the second layer 4 and oxidizing the molecules $B^-$ to B in the third layer 6.

All the molecules are in an electrically neutral form in the initial state. If the cell is rewritten, the molecules A and B are converted into an ionic form. For charge balancing, protons then flow from the second layer 4 to the third layer 6. As a result, the memory cell remains electrically neutral. Schematically, the following reactions proceed during the transition between the two states:

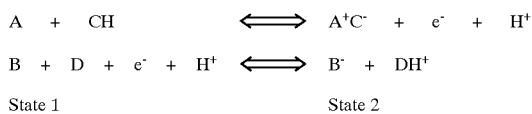

The functions A and CH or B and C may also in each case be contained in one compound, in which case two or more electrons can also be transferred per molecule.

The invention is explained in more detail using exemplary embodiments.

EXAMPLE 1

Memory Array Comprising Fullerene and Ferrocene Polymer Films Which are Separated by an Amorphous Carbon Barrier An array comprising interconnects 500 nm wide is produced and contact-connected on a silicon wafer on which chips with an electronic evaluation unit are integrated using CMOS technology. The interconnects are composed of aluminum and are covered on their top side with a conductive tantalum nitride barrier. Silicon oxide is situated between the interconnects and terminates at the same level as the interconnect as a result of a CMP (Chemical Mechanical Polishing) process. On a resist spinner, a thin film is applied using a solution comprising ferrocene (2%) and a copolymer comprising methacrylic acid and methyl methacrylate (8%) in N-methylpyrrolidone (90%) Drying on a hotplate at 140° C. gives a homogeneous film comprising ferrocene and the copolymer, said film having a thickness of 60 nm. On this layer, a PECVD (Plasma Enhanced Chemical Vapor Deposition) layer having a thickness of 40 nm and comprising methane (50 sccm) and nitrogen (10 sccm) is deposited with the aid of an ECR (Electron Cyclotron Resonance) downstream plasma (100 W, 5 μbar). A further film having a thickness of 100 nm is produced above that by spin coating using a solution comprising fullerene (0.7%) and a copolymer (2%) comprising styrene and methoxystyrene in toluene (97.3%) and drying at 140° C. A PECVD layer made of ethene (50 sccm) and having a thickness of 150 nm, deposited with the aid of an ECR downstream plasma (100 W, 5 μbar), terminates the construction. By means of a customary phototechnology, contact holes are patterned and etched in the oxygen plasma down to the bottommost wiring plane. The holes are filled with sputtered aluminum and the resist and the aluminum situated on it are removed in a lift-off process. By means of a further phototechnology, a silylatable photoresist is patterned to form an interconnect pattern rotated through 90° relative to the lower interconnects. After the silylation of the resist, the ethene PECVD layer is etched in an ECR oxygen plasma, etching being effected to a depth of approximately 40 nm into the fullerene layer. An amorphous carbon layer having a thickness of 30 nm, a titanium layer having a thickness of 10 nm and an aluminum layer having a thickness of 200 nm are sputtered into the trenches thus produced, which have a width of 500 nm. The resist and the layers of carbon, titanium and aluminum that are deposited on it are removed in a lift-off process in methoxypropyl acetate. Finally, the entire component is covered with sputtered silicon dioxide, but bonding pads are uncovered.

Selected cells are switched from the state 1 to the state 2 by the application of a voltage of 2 V between the mutually crossing lower and upper interconnects and the current flow thus initiated. As a result, the charge state of the molecules fullerene and ferrocene contained in the cell changes to the fullerene anion and to the ferrocene cation. A comparison of the charging current for charging the cell capacitances in the case of a 0.3 V pulse 10 μs long of a switched cell with that of a non-switched cell reveals that the non-switched cell has a charging current whose magnitude is twice as high. The switched cells can thereby be distinguished from the unswitched cells, which enables storage of information. The switched cells can be put back into the initial state by the application of a voltage of −2 V.

EXAMPLE 2

Memory Array Comprising Fullerene and Carboxyferrocene Films Which are Separated by an Aluminum Oxide Barrier As in Example 1, firstly a silicon wafer is fabricated on which chips with an electronic evaluation unit are integrated using CMOS technology and on which an already contact-connected array comprising interconnects 500 nm wide is situated, whose interspaces are filled with silicon oxide. A homogeneous film made of carboxyferrocene and having a thickness of 40 nm and a film made of aluminum and having a thickness of 1.5 nm are vapor-deposited on the interconnects. This construction is exposed to an oxygen atmosphere until the aluminum is oxidized through. Afterward, a film made of fullerene and having a thickness of 80 nm is vapor-deposited. A PECVD layer made of ethene (50 sccm) and having a thickness of 150 nm, deposited with the aid of an ECR downstream plasma (100 W, 5 μbar), terminates the construction. By means of a customary phototechnology, contact holes are patterned and etched in the oxygen plasma down to the bottommost wiring plane. The holes are filled with sputtered aluminum and the resist and the aluminum situated on it are removed in a lift-off process. By means of a further phototechnology, a silylatable photoresist is patterned to form an interconnect pattern rotated through 90° relative to the lower interconnects. After the silylation of the resist, the ethene PECVD layer is etched in an ECR oxygen plasma, etching being effected to a depth of approximately 40 nm into the fullerene layer. An amorphous carbon layer having a thickness of 30 nm, a titanium layer having a thickness of 10 nm and an aluminum layer having a thickness of 200 nm are sputtered into the trenches thus produced, which have a width of 500 nm. The resist and the layers of carbon, titanium and aluminum that are deposited on it are removed in a lift-off process in methoxypropyl acetate. The entire component is covered with sputtered silicon dioxide, but bonding pads are uncovered.

Selected cells are switched from the state 1 to the state 2 by the application of a voltage of 1.5 V between the mutually crossing lower and upper interconnects and the current flow thus initiated. As a result, the charge state of the molecules fullerene and carboxyferrocene contained in the memory cell changes to the fullerene anion and to the carboxyferrocene salt. A comparison of the charging current for charging the cell capacitances in the case of a 0.3 V pulse 10 µs long of a switched and of a non-switched cell reveals that the non-switched cell has a charging current whose magnitude is twice as large. As a result, the switched cells can be distinguished from the unswitched cells and storage of information is possible. The switched cell can be put back into the initial state by the application of a voltage of ×1.5 V.

EXAMPLE 3

Memory Array Comprising Fullerene and N,N-dimethyl-4,4'-dihydro-4,4'-bipyridine Films Which are Separated by an Aluminum Oxide Barrier Analogously to Example 1 and Example 2, firstly a silicon wafer is fabricated in which chips with an electronic evaluation unit are integrated using CMOS technology and on which an already contact-connected array comprising interconnects 500 nm wide, made of aluminum, is deposited, whose top side is covered with a conductive tantalum nitride barrier. Silicon oxide is situated between the interconnects and terminates at the same level as the interconnect as a result of a CMP process. On the silicon wafer, a uniform thin film is applied on a resist spinner using a solution comprising N,N-dimethyl-4,4'-dihydro-4,4'-bipyridine (2%) and a copolymer comprising methacrylic acid and methyl methacrylate (8%) in N-methylpyrrolidone (90%). Drying of the wafer on a hotplate at 140° C. yields a homogeneous film having a thickness of 60 nm and comprising N,N-dimethyl-4,4'-dihydro-4,4'-bipyridine and the copolymer. An aluminum film having a thickness of 1.5 nm is vapor-deposited thereon. This construction is exposed to an oxygen atmosphere, so that the aluminum is oxidized to the oxide. A film made of fullerene and having a thickness of 80 nm is subsequently vapor-deposited onto the aluminum oxide layer. A PECVD layer made of ethene (50 sccm) and having a thickness of 150 nm, deposited with the aid of an ECR downstream plasma (100 W, 5 µbar), terminates the construction. By means of a customary phototechnology, contact holes are patterned and etched using oxygen plasma down to the bottommost wiring plane. The holes are filled with sputtered aluminum and the resist with the aluminum situated on it are lifted off. By means of a further phototechnology, a silylatable photoresist is patterned to form an interconnect pattern rotated through 90° relative to the lower interconnects After the silylation of the resist, the ethene PECVD layer is etched in an ECR oxygen plasma, etching being effected to a depth of approximately 40 nm into the fullerene layer. An amorphous carbon layer having a thickness of 30 nm, a titanium layer having a thickness of 10 nm and an aluminum layer having a thickness of 200 nm are sputtered into the trenches thus produced, which have a width of 500 nm. The resist and the layers of amorphous carbon, titanium and aluminum that are deposited on it are removed in a lift-off process in methoxypropyl acetate. Subsequently, the entire component is covered with sputtered silicon dioxide, but bonding pads are uncovered.

Selected memory cells are switched from the state 1 to the state 2 by the application of a voltage of 1.5 V between the mutually crossing lower and upper interconnects and the current flow thus initiated. As a result, the charge state of the molecules fullerene and dihydrobipyridine contained in the cell changes to the fullerene anion and to the bipyridine dication. In a comparison of the charging current which is required for charging the cell capacitances in the case of a 0.3 V pulse 10 µs long of a switched and of a non-switched cell, the non-switched cell has a charging current whose magnitude is twice as large. As a result, the switched cells can be distinguished from the unswitched cells and storage of information has become possible. The switched memory cell can be returned to the initial state by the application of a voltage of −1.5 V.

EXAMPLE 4

Memory Array Comprising Fullerene and Carboxyferrocene Polymer Films

Analogously to Examples 1 to 3, firstly a silicon wafer is fabricated on which chips with an electronic evaluation unit are integrated using CMOS technology and on which a contact-connected array comprising interconnects 500 nm wide, made of aluminum, are already deposited, which are covered with a conductive tantalum nitride barrier on their top side. Silicon oxide is situated between the interconnects and terminates at the same level as the interconnect as a result of a CMP process. On a resist spinner, a uniform thin film is produced using a solution comprising carboxyferrocene (2%) and a copolymer comprising methacrylic acid and methyl methacrylate (8%) in N-methylpyrrolidone (90%). Drying of the wafer on a hotplate at 140° C. gives a homogeneous film comprising carboxyferrocene and the copolymer, said film having a thickness of 60 nm. On this layer, a film having a thickness of 100 nm is produced by spin coating using a solution comprising fullerene (0.7%) and a copolymer (2%) comprising styrene and methoxystyrene in toluene (97.3%) and drying at 140° C. A PECVD layer made of ethene (50 sccm) and having a thickness of 150 nm, deposited with the aid of an ECR downstream plasma (100 W, 5 µbar), terminates the construction. By means of a customary phototechnology, contact holes are patterned and etched in the oxygen plasma down to the bottommost wiring plane. The holes are filled with sputtered aluminum and the resist and the aluminum situated on it are removed in a lift-off process. By means of a further phototechnology, a silylatable photoresist is patterned to form an interconnect pattern rotated through 90° relative to the lower interconnects. After the silylation of the resist, the ethene PECVD layer is etched in an ECR oxygen plasma, etching being effected to a depth of approximately 40 nm into the fullerene layer. An amorphous carbon layer having a thickness of 30 nm, a titanium layer having a thickness of 10 nm and an aluminum layer having a thickness of 200 nm are sputtered into the trenches thus produced, which have a width of 500 nm. The resist and the layers of amorphous carbon, titanium and aluminum that are deposited on it are removed in a lift-off process in methoxypropyl acetate. Finally, the entire component is covered with sputtered silicon dioxide, but bonding pads are uncovered.

Selected memory cells are switched from the state 1 to the state 2 by the application of a voltage of 1.2 V between the mutually crossing lower and upper interconnects and the current flow thus initiated. As a result, the charge state of the molecules fullerene and carboxyferrocene contained in the memory cell changes to the fullerene anion and to the carboxyferrocene salt. A comparison of the charging current which is required for charging the cell capacitances in the case of a 0.2 V pulse 10 µs long of a switched and of a non-switched cell reveals that the non-switched memory cell has a charging current whose magnitude is twice as large. As a result, the switched cell can be distinguished from the unswitched cell and storage of information is possible. The switched memory cell can be put back into the initial state by the application of a voltage of −1.2 V.

I claim:

1. A memory cell, comprising:
   a first layer of electrically conductive material;
   a second layer disposed on and electrically connected to said first layer, said second layer containing a first chemical compound adapted to be reversibly converted from a reduced form to an oxidized form;
   a third layer disposed on said second layer and containing a second chemical compound adapted to be reversibly converted from an oxidized form to a reduced form; and
   a fourth layer of electrically conductive material disposed on and electrically connected to said third layer;
   wherein at least one of said second layer and said third layer contain groups acting as proton donors or as proton acceptors.

2. The memory cell according to claim 1, wherein at least one of said second layer and said third layer comprises a matrix in which one of said first chemical compound and said second chemical compound is distributed.

3. The memory cell according to claim 2, wherein said matrix is formed by a polymer having groups acting as proton donors or as proton acceptors.

4. The memory cell according to claim 1, wherein at least one of said first chemical compound and said second chemical compound has groups acting as proton donors or as proton acceptors.

5. The memory cell according to claim 1, wherein said matrix is formed as an energy barrier for proton transport.

6. The memory cell according to claim 1, which comprises an intermediate layer between said second layer and said third layer, said intermediate layer acting as an energy barrier for proton transport.

7. The memory cell according to claim 1, which comprises at least one proton barrier disposed between a pair of layers selected from the group consisting of said first layer and said second layer and of said third layer and said fourth layer.

8. The memory cell according to claim 1, wherein said first chemical compound is electrically neutral in an oxidized form thereof and said second chemical compound is electrically neutral in a reduced form thereof.

9. The memory cell according to claim 1, wherein a chemical potential of said first chemical compound is approximately identical in an oxidized form thereof and in a reduced form thereof.

10. The memory cell according to claim 1, wherein a chemical potential of said second chemical compound is approximately identical in an oxidized form thereof and in a reduced form thereof.

11. The memory cell according to claim 1 disposed on a substrate containing electronic circuits.

12. The memory cell according to claim 11, wherein said substrate is a flexible substrate.

13. A memory array, comprising:
    a first layer constructed of mutually parallel interconnects;
    a second layer disposed on and electrically connected to said first layer, said second layer containing a first chemical compound adapted to be reversibly converted from a reduced form to an oxidized form;
    a third layer disposed on said second layer and containing a second chemical compound adapted to be reversibly converted from an oxidized form to a reduced form; and
    a fourth layer disposed on and electrically connected to said third layer, said fourth layer being constructed of mutually parallel interconnects arranged such that, in a plan view of the memory array, said interconnects of said first layer and said interconnects of said fourth layer form crossover points; and
    one of said second layer and said third layer having groups acting as proton donors or as proton acceptors.

14. The memory array according to claim 13, wherein said interconnects of the first layer and said interconnects of said fourth layer are arranged at right angles relative to one another in a plan view of the memory array.

15. The memory array according to claim 13, wherein a plurality of sequences of said first, second, third and fourth layers are stacked one above the other.

16. A smart card, comprising a smart card body and at least one memory array according to claim 13 carried by said smart card body.

* * * * *